Aug. 4, 1953

F. S. MABRY 2,648,006

FREQUENCY GENERATOR

Filed Nov. 14, 1949

4 Sheets-Sheet 1

WITNESSES:

Robert C. Baird.

Wm. C. Groome

INVENTOR

Forrest S. Mabry.

BY

F. E. Browder

ATTORNEY

Aug. 4, 1953

F. S. MABRY

FREQUENCY GENERATOR 2,648,006

Filed Nov. 14, 1949

4 Sheets-Sheet 2

WITNESSES:
Robert A. Baird
[illegible]

INVENTOR
Forrest S. Mabry.
BY F. E. Browder
ATTORNEY

WITNESSES:
Robert C. Baird.
Wm. C. Groome

INVENTOR
Forrest S. Mabry.
BY F. E. Browder
ATTORNEY

WITNESSES:
Robert A. Baird.
Wm. C. Groome

INVENTOR
Forrest S. Mabry.
BY F. E. Browder
ATTORNEY

Patented Aug. 4, 1953

2,648,006

UNITED STATES PATENT OFFICE 2,648,006

FREQUENCY GENERATOR

Forrest S. Mabry, Baltimore, Md., assignor to Westinghouse Electric Corporation, East Pittsburgh, Pa., a corporation of Pennsylvania Application November 14, 1949, Serial No. 127,156

12 Claims. (Cl. 250—36)

Figure 2:
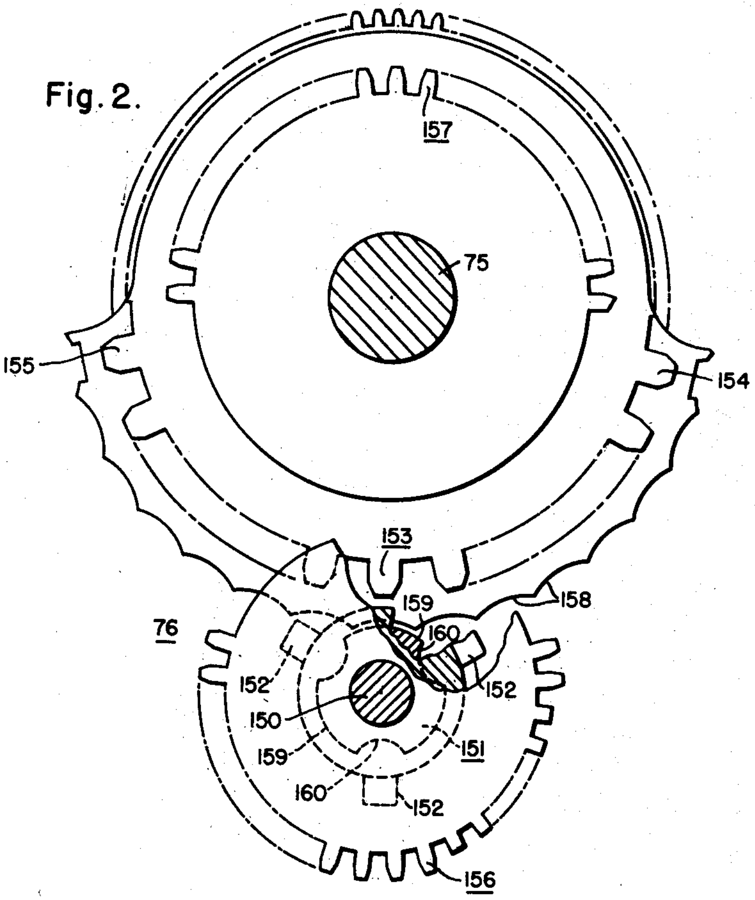
Figure 1A:
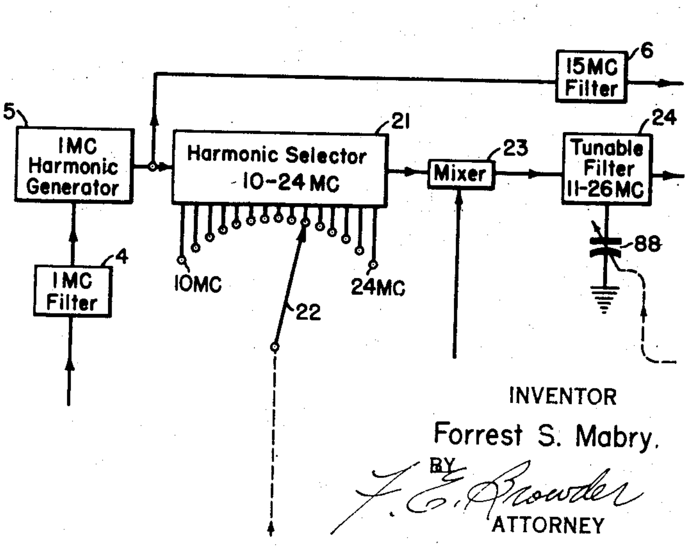
Figure 1B:
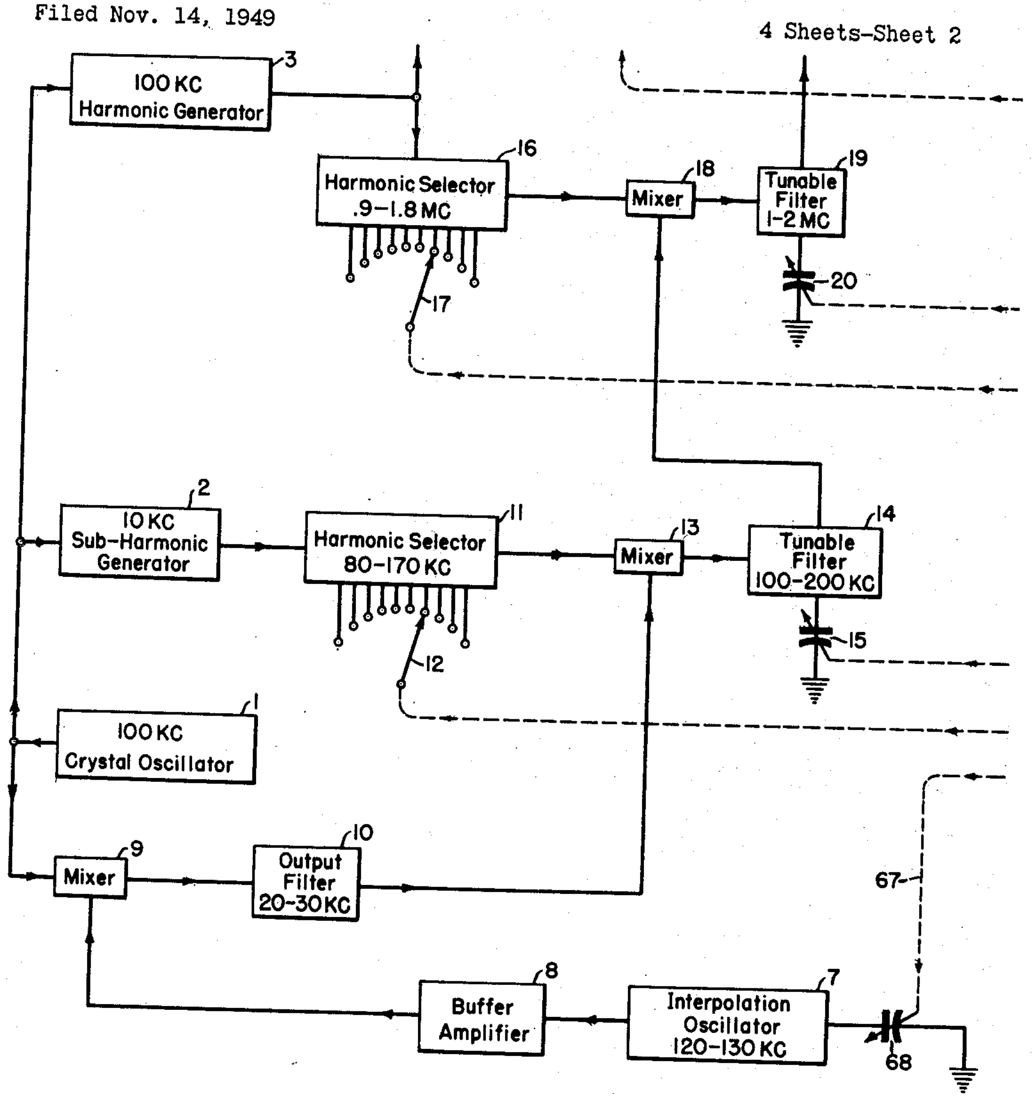
Figure 1C:
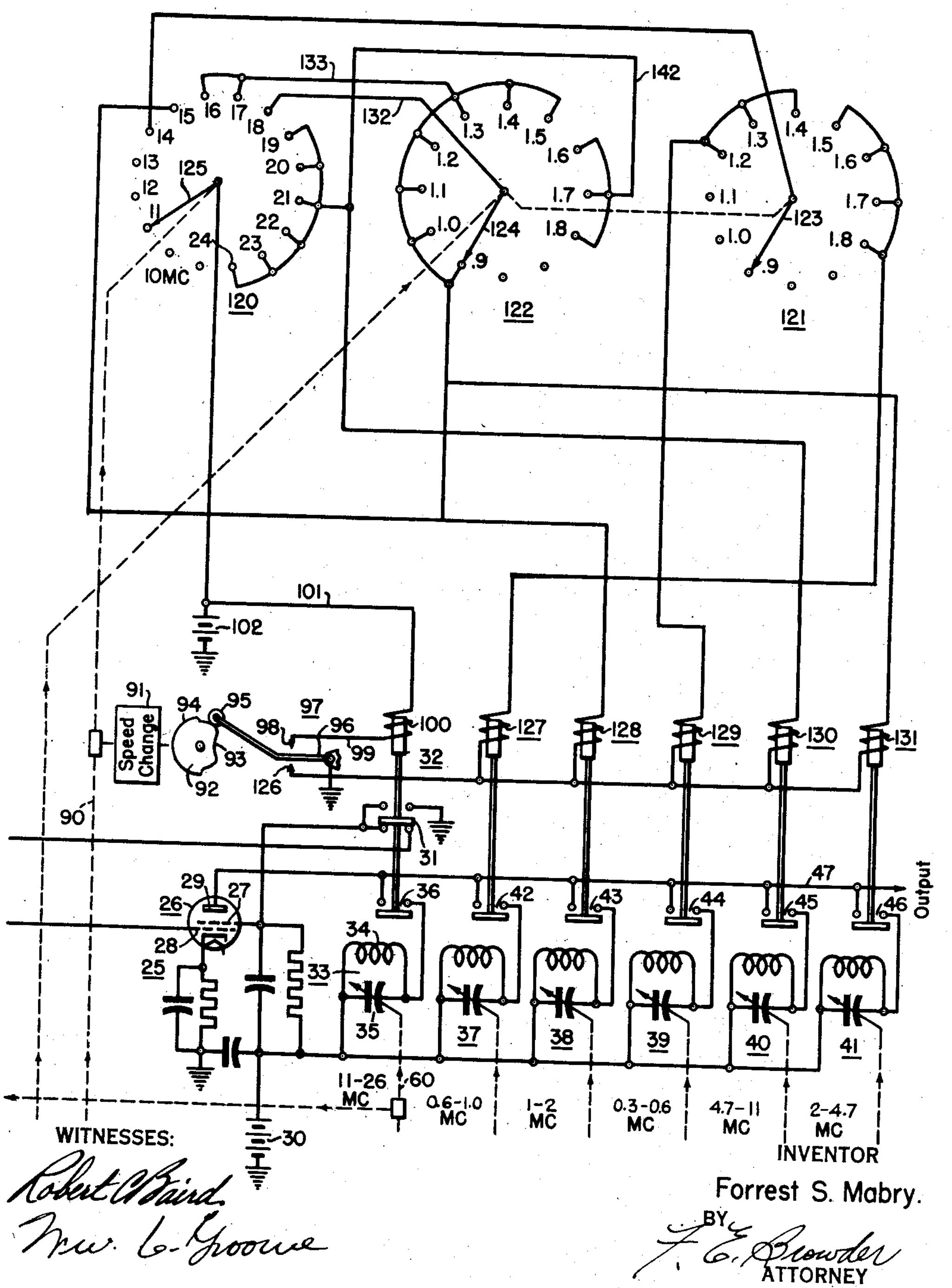
Figure 1D:
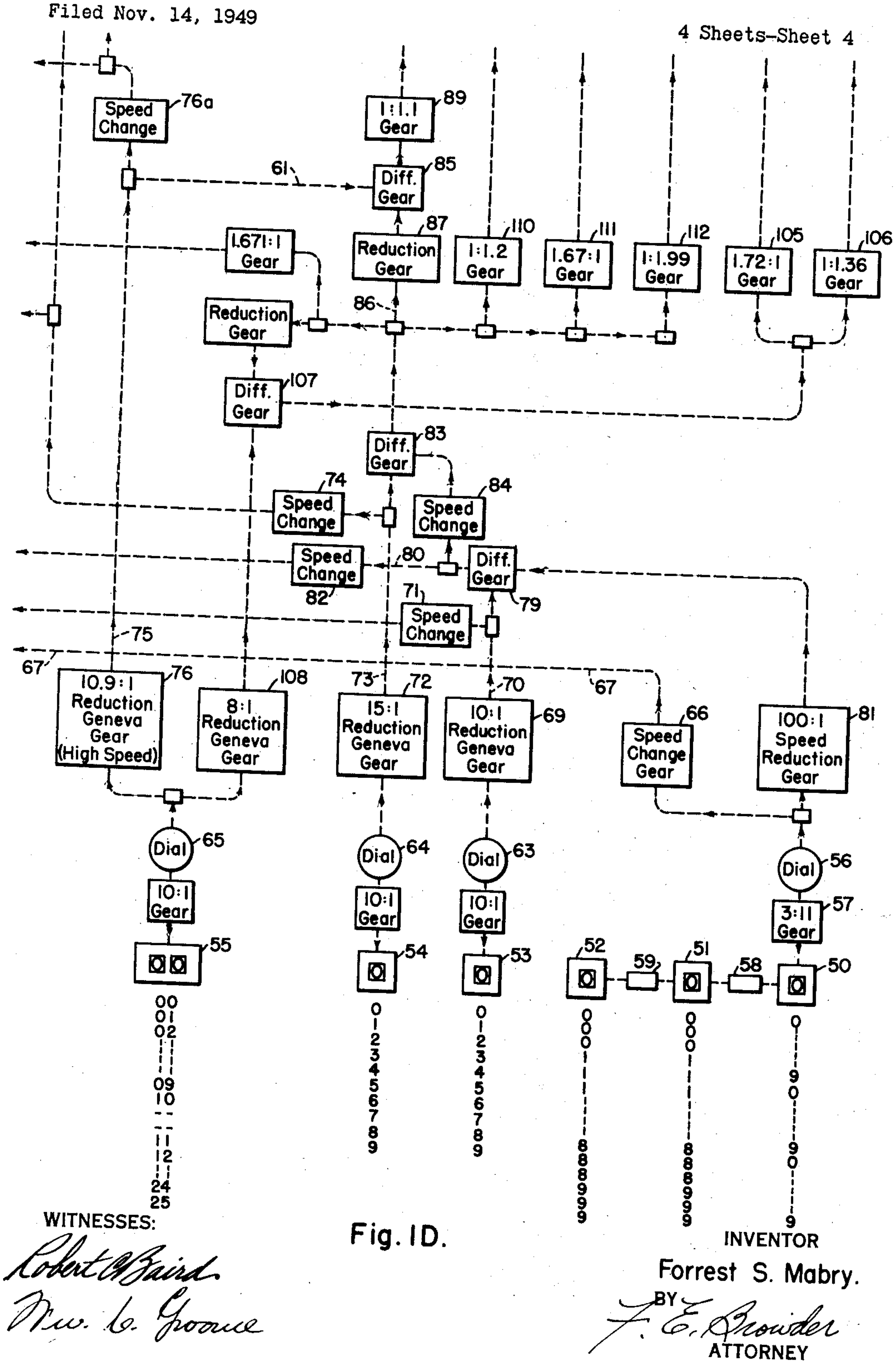

The present invention relates generally to systems for readily producing any desired frequency within an extremely wide frequency range, and more particularly to systems for generating any desired frequency within a wide frequency range by combination of a plurality of harmonics derived from a single highly stable source of oscillations, with signals derived from a continuously variable low frequency oscillator.

It is known that great difficulties have been encountered, in the art relating to radio transmitters of the variable frequency type, in designing a frequency source which is capable of operation over an extremely wide frequency range, and wherein any desired output frequency may be obtained accurately and rapidly, the output frequency being extremely stable. It is further known that frequency sources utilizing quartz crystal oscillating elements for frequency control are inherently highly stable, and that the frequencies provided by sources of this character may be very accurately predetermined by proper fabrication of the quartz crystals, and by maintaining the latter under conditions of constant temperature and humidity. While a large number of precise frequencies may be derived from a single quartz crystal oscillator by processes of frequency division and frequency multiplication, such frequencies are limited to harmonics and sub-harmonics of the basic frequency of the quartz crystal frequency oscillator, so that the signal source has a relatively limited number of possible output frequencies.

Systems are further known wherein harmonic frequencies derived from a single quartz crystal controlled oscillator may be combined by means of mixing circuits, whereby to increase very greatly the total number of output frequencies available in the system. Systems of the latter kind, however, are relatively complex, and, in order that a desired frequency may be obtained, means must be provided for selecting from the harmonic generators driven by the original quartz crystal controlled source certain frequency components for application to mixers, and, further, means must be provided for selecting from the outputs of the mixers desired resultant frequencies for further combination to form a single ultimately desired frequency. Consequently, a large number of adjustments must be consummated, which cannot be readily done by unskilled personnel. Additionally, unless suitable frequency monitors are provided, it can never be known that an error has not been made in the adjustment of one of the circuits involved in generating the desired frequency. Provision of a suitable frequency monitoring system for monitoring an extremely large band of frequencies and for determining accurately the value of any one of the latter, becomes as complicated and difficult a problem as the generation of the desired frequency.

It is desirable to provide a system for generating any one of an extremely large number of frequencies within a very wide frequency range, by means of devices which may be operated by completely unskilled personnel, and in which the desired output frequency may be obtained with complete certainty. For certain applications, for example, the desired range of frequencies may extend from .3 megacycles, per second to 26 megacycles per second and the desired output frequency may be required to be established with an error of 30 cycles per second or less at any position within this range, and $\pm 5$ cycles per second at low frequencies, say at 300 kc.

Briefly described, in accordance with the present invention, production of any frequency within an extremely wide frequency range is accomplished by generating, in response to a single master crystal controlled oscillator, a number of decimally related groups of harmonics and sub-harmonics, certain ones of each group being selected by suitable filtering devices. The frequencies selected by the filtering devices may then be combined by means of a series of modulators or mixers, each of which combines a pair of decimally adjacent frequencies to produce a resultant frequency, each resultant frequency then being recombined with a further one of the harmonic frequencies, in a further mixer, to provide a further resultant frequency, the process of harmonic selection and frequency combination being continued until the ultimately desired frequency is formed. The action of the system is then, essentially that of supplying to a succession of frequency mixers or combiners appropriate primary frequencies, which may themselves be formed by a combinatory process, but which are ultimately derived from a single crystal controlled frequency. In selecting from among the signals provided by each of the mixers a desired resultant frequency, which may be applied to a further mixer, each of the mixers must be so designed as to reject unwanted frequencies and to establish at its output a single frequency only. Hence, the harmonic and sub-harmonic frequencies selected for utilization in forming any ultimately desired frequency should be so selected as not to provide an insoluble filtering problem in respect to selection of harmonics, and in respect to selection of mixer output components.

In order to provide extremely great convenience and rapidity of frequency selection, the selection is accomplished by setting up the separate decimally related digits representing a desired frequency on a plurality of numbered counter wheels or dials, separate ones of which are each provided with the numerals 0–9, equally spaced thereon, and each wheel or dial representing one of the digits of the ultimate frequency. In one practical application of the present invention seven wheels or dials are provided, to enable establishment of frequencies requiring seven numerals for their complete specification.

Each of the counter wheels is mechanically coupled with suitable filter circuits for selecting harmonics, and with further devices for modifying the tuning of the output circuit of various of the mixing circuits heretofore referred to, so that upon establishing a given number on the counter wheels, appropriate filter circuits are automatically established and tuned to the proper frequencies. Each one of the counter wheels is positionable independently of the others, except the wheels of the two highest orders, which are composite, and the three wheels of lowest order, which are mechanically coupled by means of Geneva transfer mechanisms. The frequency established at the output of a mixer corresponding with a predetermined digit of the desired frequency value is influenced by the character of all digits of lower order than the predetermined digit, an increase or decrease of a lower digit contained in the desired frequency influencing the desired output of the mixer despite the fact that the predetermined digit does not change in value. The output frequency to which the output filter of each of the mixers must be tuned is composite, being influenced by both of the input frequencies to the mixer. In order to insure that the mixer will at all times be tuned precisely to the sum or difference of the input frequencies applied thereto, as may be necessary in the operation of the system, the output filters of the mixers are each controlled by means of a differential gearing, appropriately driven from the dials in accordance with the numerical positions of the dials within the dial assembly, and with the decimal values of the dials with respect to each other.

It is accordingly a broad object of the present invention to provide a system for facilitating the generation of any desired frequency within a wide range of frequencies.

It is a further object of the invention to provide a system for generating any desired frequency within a wide range of frequencies, the desired frequency being essentially controlled by a quartz crystal fixed frequency master oscillator, or other extremely stable oscillator.

It is another object of the invention to provide a system for generating any desired frequency within an extensive frequency spectrum by combining in a decade arrangement harmonically related frequencies deriving from a stable single frequency master oscillator, and from a continuously tunable interpolation oscillator.

It is still another object of the invention to provide a system for selectively generating any desired frequency within a wide spectrum, under control of a crystal controlled or other stable single frequency source, by establishing a number corresponding with the value of the desired frequency on a series of decimally interrelated dials or counter wheels, which may be individually manually settable, or remotely controlled.

The foregoing, as well as further objects and advantages of the present invention, will be made evident by reference to the following detailed description of a specific embodiment of the invention, especially when taken in conjunction with the accompanying drawings, wherein, Figures 1A, 1B, 1C and 1D, taken together, provide a schematic block diagram illustrating the mode of inter-connection of the various components of the system, together with conventionalized representations of the various gearings required in order to establish the tuning of the various tunable circuits comprised in the system in response to settings of counter wheels or dials to a desired frequency; and Figure 2 is a view in plan of an intermittent gearing system utilized in the system.

*Generation of component frequencies*

Referring now more specifically to the drawings, the reference numeral 1 identifies a crystal oscillator, which generates signals at a frequency of 100 kc., and which may be assumed to be extremely accurate with respect to its frequency output, i. e., to less than .1 cps. The output of the crystal oscillator 1 is applied to a sub-harmonic generator or frequency divider 2 which supplies a large number of sub-harmonics, spaced apart by 10 kc. The output of the crystal oscillator 1 is likewise applied to the input of a harmonic generator 3, which is arranged to provide output frequencies or harmonics spaced apart by 100 kc. The tenth harmonic of the harmonic generator 3, a frequency of 1 mc., is applied to the input of a 1 megacycle per second filter 4, which selects the tenth harmonic to the exclusion of all the other harmonics present in the output of the harmonic generator 3, applying the one megacycle per second signal to a one megacycle per second harmonic generator 5, at the output of which is available a large number of signals separated mutually by frequency differences of one megacycle per second. The fifteenth harmonic of the output of the harmonic generator 5, specifically fifteen megacycles per second, is applied to a fifteen megacycle filter 6, at the output of which is present, then, a signal at fifteen megacycles per second only, to the exclusion of all other harmonics present in the output of the one megacycle generator 5.

There is further provided an interpolation oscillator 7, which is continually tunable over the range 120 kc. to 130 kc. The output of the interpolation oscillator 7 is applied to the input of a buffer amplifier 8, the output of which is in turn applied to the input of a mixer 9. The buffer amplifier 8 serves to isolate the interpolation oscillator 7 from the mixer 9, in accordance with principles well known in the art. To the input of the mixer 9 is additionally applied signals deriving directly from the 100 kc. crystal oscillator 1, the mixer serving to subtract the 100 kc. output of the crystal oscillator 1 from the frequency of the output of the interpolation oscillator 7, so that at the output of the mixer 9 is available a frequency variable within the band 20 kc. to 30 kc. The latter band may be selected by an output filter 10, whch serves to remove all components present in the output of the mixer 9 except those falling within the band 20 to 30 kc. Accordingly, at the output of the filter 10 is available a frequency which may fall anywhere within the band 20 kc. to 30 kc., the precise frequency being selected by tuning or adjustment of the interpolation oscillator 7.

It has been found as a matter of practical design that the output of the interpolation oscillator 7 may be adjusted with an accuracy of several cycles per second, so that the output of the filter 10 may be assumed to be accurate within better than ± five cycles per second.

Connected in cascade with the sub-harmonic generator 2 is a harmonic selector 11 which, physically, may comprise a number of tuned circuits or a number of crystal filters and a selector switch 12 for selecting which one of the tuned circuits or crystal filters will be placed in circuit with the sub-harmonic generator 2. The tuned circuits present in the harmonic selector 11 constitute single frequency pass filters, in the range of frequencies available for selection, and comprising in the present embodiment of the invention the arithmetic series 80, 90, 100, . . . 170 kc. Accordingly, the harmonic selector 11 is capable of performing the function of selecting one of the harmonics present in the output of the sub-harmonic generator 2, within the range 80 to 170 kc., inclusive.

The signal available at the output of the filter 10, and the signal provided by the harmonic selector 11, are applied to the input circuit of the mixer 13, which combines the frequencies applied thereto in an additive sense, so that at the output of the mixer 13 is available a minimum frequency of 100 kc., formed by combining the minimum frequency 80 kc., available at the output of the harmonic selector 11, with the minimum frequency 20 kc., available at the output of the filter 10. The maximum output frequency of 200 kc. is made available by combining additively the maximum output frequency of 170 kc. available at the output of the harmonic selector 11 with a frequency of 30 kc., constituting the maximum output frequency available from the filter 10.

Since the interpolation oscillator 7, which supplies signals of variable frequency to the output filter 10, is continually tunable, so also the output of the mixer 13 is continually variable over the band 100 to 200 kc. The accuracy of the output of the mixer 13 is determined primarily by the accuracy of the interpolation oscillator 7, which has been found in a practical design to be within ± five cycles per second.

Since a plurality of frequencies is normally available in the output of the mixer 13, these frequencies corresponding with sum and difference frequencies, as well as with the original frequencies applied to the input of the mixer 13, a tunable output circuit 14 is provided for the mixer 13 which may be tuned by means of a variable condenser 15 to select the desired sum frequency component. For purposes of convenience, and to simplify the character of the tunable output circuit 14, the mixer 13 may be a balanced mixer, which attenuates almost entirely one of the frequencies applied thereto. However, the use of a balanced mixer as against a single ended mixer involves merely a matter of choice, having no essential relation to the principle of the present invention.

The output of the harmonic generator 3 is applied to the input of the harmonic selector 16, which is constituted of a plurality of tuned filter circuits, selectable by means of a selective switch 17, having ten switch contacts, and each filter circuit passing one only of the harmonics provided by the harmonic generator 3. Filter circuits are available, specifically, for selecting those harmonics falling within the arithmetically progressing range .9, 1.0, 1.1, . . . 1.8 mc., inclusive.

The output of the harmonic selector 16 is applied to the input of a mixer circuit 18, which may be similar to the mixer circuit 13, and to which is also supplied the output frequency available at the output of the tunable filter 14. The mixer 18 serves to add the frequencies supplied thereto, a desired output frequency being selected by means of a tunable output filter 19, which is tunable in response to the setting of a variable condenser 20. Since the output of the tunable output filter 14 constitutes a frequency variable anywhere within the band 100 to 200 kc., and since the output of the harmonic selector 16 constitutes one of the frequencies .9, 1.0, 1.1, . . . 1.8 mc., the output sum frequency available at the output of the tunable filter 19 falls within the range 1 to 2 mc., and is continually variable over that range. The lowermost of the frequencies available, i. e., 1 mc., is derived by adding the lowermost harmonic available at the output of the harmonic selector 16, specifically .9 mc., to the lowermost output frequency available at the output of the tunable circuit 14, constituting a frequency of 100 kc., the sum being 1 mc. The maximum output frequency available from the filter 19 is formed by combining the maximum output available at the harmonic selector 16, specifically 1.8 mc., with the maximum frequency available at the output of the tunable output circuit 14, specifically 200 kc., providing a sum frequency of 2 mc. By reason of the fact that the tunable output available from the filter 14 is continuously variable, over the band 100 to 200 kc., the output available from the tunable output filter 19 is likewise continuously variable within the band 1 to 2 mc.

The output of the 1 mc. harmonic generator 4 is applied to a harmonic selector 21, constituting specifically a plurality of tuned circuits, each of which is tuned to one of the harmonics of those available in the output of the harmonic generator 5, and specifically to the harmonics 10, 11 . . . 24 mc., both inclusive, selection being accomplished by means of the selective switch 22. The output of the harmonic selector 21 is applied to a mixer 23, to which is also applied the output available from the tunable filter circuit 19, the mixer 23 providing a resultant sum frequency which may fall anywhere within the range of 11 to 26 mc. The lowermost frequency, 11 mc., is formed by combination of the 10 mc. harmonic available at the output of the selector 21 with the 1 mc. signal available at the output of the filter 19, and the output frequency 26 mc. is formed by combination of the maximum available output frequency from the selector 21, specifically 24 mc., with the maximum frequency available from the filter 19, specifically 2 mc.

By virtue of the fact that the signal available at the output of the filter 19 is continuously variable over the range 1 to 2 mc., the output of the mixer 23 is likewise similarly continuously variable. The desired frequency, available at the output of the mixer 23, is selected by means of a tunable output filter 24, which excludes all components of conversion present in the output of the mixer 23 except the desired sum frequency.

The output of the tunable output filter 24 is applied to a mixer-amplifier circuit generally indicated by the numeral 25, and comprising a pentode vacuum tube amplifier 26, having two control electrodes 27 and 28, and an output electrode or anode 29, the latter being energized by a suitable source of potential conventionally illustrated as a battery 30. The mixer-amplifier circuit 25 is operated as an amplifier when the selected or desired frequency falls within the band 11 to 26 mc., inclusive, and as a mixer circuit for providing a selected frequency within the band of frequencies 300 kc. to 11 mc. in another mode of operation, hereinafter to be described.

While the mixer-amplifier 25 is operating as an amplifier, contact 31 of a two position switch 32 is grounded, ground potential being thus transferred to the control electrode 27 of the vacuum tube 26. The output of the tunable filter 24 is applied to the other control electrode 28 of the vacuum tube 26, this output constituting then the only output to the pentode 26, and the latter then operates into a tunable output circuit 33 comprising a fixed inductance 34 and a variable condenser 35, the latter being variable over a range of capacities adequate to enable tuning of the circuit 33 over the range of frequencies 11 to 26 mc. The circuit 33 is connected in series with the plate or anode 29 of the pentode 26, in response to closure of switch contacts 36, which are closed whenever the contact 31 is grounded. With the switch contacts 36 open, and the switch 31 ungrounded, a circuit is completed by switch 32 from 15 mc. filter 6 to control electrode 27, which serves to introduce on the control electrode 27 of the vacuum tube amplifier tube 26 output signal derived from the 15 mc. filter 6, and the pentode 26 then operating as a mixer, serves to subtract from the frequency falling within the range 11–26 mc. which is applied thereto by the tunable filter 24, the frequency 15 mc. provided by the filter 6.

While the mixer-amplifier tube 26 is operating as a mixer for supplying a difference frequency at its output, the tunable output filter 24, and the harmonic selector 21, are always so ordered as to provide a frequency greater than the frequency 15 mc., in a manner to be described hereinafter, so that the output frequency of the mixer-amplifier pentode 26 is always constituted of a frequency formed by subtracting from the frequency provided to the mixer-amplifier pentode 26 by the tunable output filter 24, the frequency 15 mc. provided by the filter 6, leaving a difference frequency of positive algebraic sign.

While the pentode 26 is operating as a mixer, arrangements are made for connecting in series between the source of potential 30 and the anode 29 of the pentode 26, one of the series of tunable filters 37, 38, 39, 40 and 41, which cover respectively the frequency bands 4.7 to 11 mc., 2 to 4.7 mc., 1 to 2 mc., .6 to 1.0 mc., and .3 to .6 mc. The selected one of the filter circuits 37 to 41, inclusive, is connected by the appropriate one of switches 42, 43, 44, 45 and 46.

The anode 29 of the mixer pentode 26 is permanently connected to an output lead 47. The output of the amplifier-mixer pentode 26, as it is developed across one of the tuned circuits 33, 37, 38, 39, 40, 41, may be applied to the output lead 47 for application to any desired purpose or use, as, for example, to control the frequency of a transmitter, or the like.

It is especially to be noted that the output frequency provided on the lead 47 is formed entirely by combinations of harmonics available from harmonic generators controlled from a crystal controlled oscillator 1, except in respect to that component of output frequency available on the lead 47 which is provided by the interpolation oscillator 7. Since the latter operates at a relatively low frequency, the frequency error of its output may be assumed to be as small as that of any harmonic signal available plus that due to the interpolation oscillator 7 so that the frequency of output available on the output lead 47 may be assumed, in practice and at the higher frequencies, to be largely controlled with respect to its accuracy by the crystal oscillator 1, while at the lower output frequencies the error of the interpolation oscillator is controlling. In a practical application of the presently described embodiment of my invention, it has been found that the output frequency available on the lead 47 may be controlled to within plus or minus 30 cycles per second or better at the high end of the band, and 5 cycles per second or better at the low end, this output frequency being continually selectable anywhere within the band .3 to 26 mc.

*Automatic selection of frequency*

The problem is presented of adjusting the interpolation oscillator 7, the harmonic selection circuits 11, 16 and 21, and the tunable mixer output circuits 14, 19 and 24 and the tunable output or load circuits for the mixer-amplifier pentode 26, constituting the tunable circuits 33, 37, 38, 39, 40 and 41, accurately and conveniently for any desired output frequency, and especially of providing a mechanism for obtaining the proper adjustments with extreme rapidity, and in a manner which requires no skill on the part of the operator, yet which is practically devoid of the possibility of error.

This problem has been solved in the present invention by providing various mechanical devices for automatically establishing proper adjustments of all the tunable circuits of the system in response to the settings of a plurality of numerically calibrated counter wheels, the system being so arranged that upon establishment of a number on the wheels, corresponding with a desired frequency in the band .3 to 26 mc., all of the tunable circuits comprised in the system are properly and automatically established to provide the desired output frequency.

In accordance with the invention, a number of counter wheels is provided, identified by the numerals 50, 51, 52, 53, 54 and 55. The numeral wheel 50 represents tens of cycles per second, or hundredths of kilocycles per second, and the remaining wheels represent, in ascending order of their identifying numerals, successive multiples of ten times the frequency represented by the counter wheel 50, so that the wheel 55 indicates tens and units of megacycles per second.

Since the highest frequency desired to be made available in the system is 25.99999 mc., the wheel of highest order, 55, is required to have twenty-six numerals, from 00 to 25, arranged in order about the periphery thereof, the numerals on the wheel 55 being arranged, then, in pairs of digits. The wheels 53 and 54 contain single digits only from 0 to 9, inclusive. The wheels 51 and 52 contain the digits from 0 to 9, inclusive, in groups of three about their peripheries, while the wheel 50 contains the numerals from 0 to 9 repeated three times about its periphery. This arrangement is largely for purposes of mechanical convenience. As an additional point, the purpose of which will appear hereinafter, the wheel 55 contains, intermediate the numerals 10 and 11 two blank spaces containing no numerals, so that the wheel 55 must be turned through three positions in changing the designated quantity from 10 to 11 or from 11 to 10.

The numeral wheel 50 is driven from a dial 56, by a gearing 57 having a 3 to 10 step-up ratio. Accordingly, each three rotations of the dial 56 accomplishes ten rotations of the wheel 50, and since the wheel 50 contains three sequences of the numbers 0 to 9, three rotations of the dial 56 is equivalent to adding 300 numbers into the wheel 50, or 10 rotations adds 1,000 numbers. Since each number represents 10 cycles this covers a frequency change of 10 kilocycles per second.

The wheel 50 is coupled to a tens transfer mechanism 58, which serves to move the wheel 51 by an increment of one numeral each time that the wheel 50 turns through a distance corresponding with ten numerals, and specifically while the wheel transfers from the numeral 9 to the numeral 0, the wheel 51 being stationary or motionless except during this operation.

Likewise, the wheel 52 is driven from the wheel 51, by means of a conventional tens transfer mechanism represented conventionally at 59. While the wheels 51 and 52 are driven from the wheel 50, and cannot be independently positioned, the wheels 53, 54 and 55 each are positioned manually, independently of the others, by actuation of the dials 63, 64 and 65, inclusive, one turn of each of the dials serving to advance the corresponding numeral wheel 53, 54, 55 by one place.

A desired frequency may be set into the system then by rotating the dials 56, 63, 64 and 65 until the counter wheels 50, 51, 52, 53, 54, and 55 display the desired frequency. By means of mechanical movements, hereinafter described, actuation of the counter wheels 50 to 55, inclusive, is accompanied by selection of frequencies by the harmonic selectors 11, 16 and 21 and by the interpolation oscillator 7, as well as by appropriate tunings of the tunable output filters 14, 19 and 24 and of the output filters 34 and 37 to 41, inclusive, such that the system generates precisely the frequency established on the counter wheels.

Dial 56, by means of a speed change gear 66 having an appropriate ratio for driving a shaft 67, is caused to actuate the tuning condenser 68 of the interpolation oscillator 7 so that when the counter wheels 52, 51, 50 read 000 the frequency of the interpolation oscillator 7 is established at 120 kc., and so that when the counter wheels 52, 51, 50 read 999 the tuning condenser 68 of the interpolation oscillator 7 is so adjusted that the interpolation oscillator 7 generates a frequency of 129.99 kc. Intermediate settings of the counter wheels 52, 51, 50 produce intermediate output frequencies proportional to the settings.

Similarly the dial 63, by means of a Geneva reduction gear 69, which translates the successive rotation of the dial 63 into small intermittent motions of the shaft 70, is caused to actuate the arm of the selector switch 12 of the harmonic selector 11, via a speed change gear 71.

The Geneva transfer gear 69 serves to translate each turn or rotation of the dial 63 into a single angular advance of the shaft 70, and the speed change gear 71 serves to translate motion of the shaft 70 into a motion appropriate to the angular spacings of the contacts required to be covered by the selector arm of the selective switch 12. Accordingly, the harmonic selector 11 is caused to select that harmonic corresponding with the numerical setting of the counter wheel 53, the numerical setting 0 corresponding with selection of the harmonic 80 kc., and the numerical setting 9 corresponding with harmonic selection of a frequency 170 kc., at the output of harmonic selector 11.

The setting of the counter wheel 54, in response to motion of the dial 64, is likewise duplicated at the harmonic selector 16, motion of the dial 64 being transferred to the selector arm 17 via a Geneva motion 72, which serves to advance the shaft 73 by a predetermined angular increment in response to each single rotation of the dial 64. The motion of the shaft 73 is transferred via an appropriate speed change gear 74 to the selector arm of the selector switch 17 of the harmonic selector 16, the various speed changes being so related to the required motion of the selector arm 17 that each advance of one number on the counter wheel 54 results in a corresponding advance of the selector arm 17 to a succeeding contact of the selective switch 16. Accordingly, the harmonic selector 16 is caused to select one harmonic signal within the frequency range .9 to 1.8 mc., the selected frequency corresponding with the numerical setting of the counter wheel 54 over the range 0 to 9.

In a similar manner the numerical position of the wheel 55 is duplicated at the shaft 75, by coupling the shaft 75 to the dial 65 by means of an appropriate Geneva reduction gear 76. The gear 76 has been designated on the drawings as a high speed Geneva gear. This gear is of unconventional character, for purposes which will appear as the description proceeds, and is illustrated in detail in Figure 2 of the accompanying drawings. However, at the present stage of the description the simplifying assumption may be made that the gear 76 operates as a conventional Geneva motion, to provide intermittent angular advances of the shaft 75 in response to each turn of the dial 65. The shaft 75 operates via an appropriate speed change gear **76*a* to position the selector arm of switch 22 of the harmonic selector 21 over the range of harmonics 10 to 24 mc., inclusive, in accordance with the settings of the number wheel 55. It should be noted that there are more available positions of wheel 55 than of selector switch 22**. The seeming inconsistency will be resolved, hereinafter, at an appropriate place in the description.

The tunable filter 14 is required to be tuned to the sum of the frequencies provided by the harmonic selector 11 and by the output filter 10. To accomplish this purpose the tuning condenser 15 of the tunable filter 14 is controlled by means of a differential gear 79. The inputs to which are derived from the dials 56 and 63 in a manner such that the motion of the output shaft 80 of the differential gear 79 will sum the motions of the dials 56 and 63, having due regard for their decimal values, and so that the ultimate position of the shaft 80 will be representative of the numerals inserted in the wheels 53, 52, 51, 50. For this purpose, the rotation of the dial 56 is reduced by means of a suitable speed reduction gear 81, while the motion of the dial 63 is inserted into the differential gear 79 by means of the shaft 70, which possesses intermittent motion corresponding with the intermittent motion of the counter wheel 53, and which is introduced into the shaft 70 by the 10:1 Geneva reduction gear 69. The Geneva reduction gear 69, in introducing a ten to one speed reduction, translates each rotation of the dial 63 into a predetermined angular motion of the shaft 70, while the speed reduction of 100:1 introduced by the speed reduction gear 81 and the differential gear 79 takes account of the fact that the counter wheel 52 rotates ten times as fast as does the counter wheel 53, for a given change in desired frequency. Speed change gearing 82 is provided, intermediate the shaft 80 and the tuning condenser 15 for the tunable filter 14, to correlate the motion of the shaft 80 with the total possible rotation of the movable plates of the variable condenser 15. This condenser, being of straight-line frequency characteristic, has equal change in its tuned circuit for equal shaft rotations, regardless of the actual shaft position.

The tunable output filter 19 is required to be tuned to a frequency equal to the sum of the frequencies provided by the harmonic selector 16 and by the tunable filter 14. Accordingly, the tunable filter 19 is tuned by means of a condenser 20 actuated by a differential gearing 83 driven from the shaft 73 which represents the position of the counter wheel 54, and which serves to determine the position of the selector arm of switch 17 of the harmonic selector 16, as well as by the output of the differential gear 79 which represents the frequency to which is tuned the tunable filter 14. By virtue of the fact that full scale rotation of the movable plates of the variable condenser 15 introduces a change in the output frequency derivable from the filter 19 corresponding to that introduced by one-tenth full scale rotation of the tuning condenser 20 of the tunable filter 19, the mechanical coupling between the differential gear 79 and the differential gear 83 is accomplished via a suitable speed reduction gearing 84. The tunable output filter 19 is accordingly tuned to a frequency equal to the sum of the frequencies provided by tunable filter 14, and of the frequency provided by the tunable harmonic selector 16, and passes a frequency within the band 1 to 2 mc., corresponding with the reading of the counter wheels 54, 53, 52, 51, 50.

The tunable filter 24 is required to be tuned to a frequency equal to the sum of the frequencies provided by the harmonic selector 21 and by the tunable output filter 19. Accordingly, the tunable output filter 24 is tuned by means of a differential gearing 85, to the input shafts of which are applied as one component, angular motion of the output shaft 86 of the differential gearing 83, reduced by a suitable factor by means of the speed reduction gearing 87, to take account of the decimal relation between shaft positions of the shaft 86 and of the shaft 75 representing the positions of the selector arm 22, and which is applied via a shaft extension 61 to an input shaft of the differential gearing 85. The output shaft of the differential gearing 85 is applied to control the position of the tuning condenser 88 of the tunable filter 24, via a suitable speed change gearing 89, which is adapted to correlate the total motion of the output shaft of the differential gearing 85 to the total possible motion of the variable plates of the variable condenser 88.

The output of the tunable filter 24 is applied to the control electrode 28 of the mixer amplifier pentode 26.

If the counter wheel 55 has been set up to establish a frequency within the band 11 to 25 mc., inclusive, no input is provided to the control electrode 27 of the mixer amplifier tube 26 from the 15 mc. filter 6, as has been explained hereinbefore, and the output of the tunable output filter 24 is amplified in the mixer-amplifier 25, now operating as a true amplifier, and applied to the lead 47 via the tunable output filter 33, which is tuned by means of a variable condenser 35 driven from a shaft 60 coupled to the output shaft of the speed change gearing 89, so that the motion of the condenser 35 duplicates the motion of the condenser 88.

If, on the other hand, the counter wheel 55 has been set up to establish a pair of numerals in the range 00 to 10, an entirely different type of operation takes place, as will now be explained.

*Generation of frequencies below 11 mc.*

Driven by means of a shaft 90 in tandem to the shaft driving the selector arm 22 of harmonic selector 21, and via a 3 to 1 reduction gear 91 is a cam 92, which accordingly assumes an angular position at all times corresponding with the position of the selector arm 22, and in correspondence with the frequency provided by the harmonic selector 21. The cam 92 is provided with a dwell 93, and with a rise 94, and actuates a cam follower 95. While the cam follower 95 is on the rise of the cam the movable arm 96 of a micro-switch, generally indicated by the reference numeral 97, is raised into contact with a stationary contact 98 of the switch 97, and the movable arm 96 being permanently grounded, ground potential is transferred to the contact 98. The contact 98 is connected via lead 99 with one terminal of a relay coil 100, the remaining terminal of which is connected via a lead 101 with the positive terminal of a source of potential 102, conventionally represented as a battery, the negative terminal of which is grounded. Accordingly, whenever the cam follower 95 is positioned on the rise of the cam 94 the relay coil 100 is energized from the potential source 102, whereupon it pulls up and grounds contact 31, and closes the switch 36. Grounding of the contact 31 serves to ground the input electrode 27 of pentode 26, while closure of the contacts 36 serves to introduce, in the plate circuit of the mixer amplifier pentode 26, the tunable filter circuit 33, appropriate for operation within the range of frequencies 11 to 26 mc., inclusive. By suitable design of the speed reduction gear 91, the arrangement of the dwell 93 and of the rise 94 with respect to the follower 95 of the cam 92 may be arranged so that whenever the counter wheel 55 is set to read 11 to 25, inclusive, switch arm 96 is raised and the relay 100 is energized. When the wheel 55 reads any of the numbers 00 to 10, inclusive, on the other hand, it is desired that the output of the 15 mc. filter 6 be applied to the control electrode 27 of the pentode 26, via the switch 32, and that one or another of the tunable filter circuits 37, 38, 39, 40, 41 be connected in the plate circuit of the pentode 26, the use of the latter plurality of circuits being required because of the extremely wide frequency range covered, on a percentage basis, while the number wheel 55 varies over positions 00 to 10.

It will be noted, however, that the harmonic selector 21 covers the range 10 to 24 mc. only, and that the tunable filter 24 covers the range 11 to 26 mc. only, and, accordingly, that provision must be made for generating frequencies within the band .3 to 11 megacycles by converting the output of the tunable filter 24 against the output of the 15 mc. filter 6.

For example, if a frequency of ten mc. is required at the output of the system, the harmonic selector 21 must be set to pass a frequency of 24 mc., which may be added in the mixer 23 to a frequency of one mc. provided by the tunable filter 19, and the frequency 25 mc. being selected by the tunable filter 24, is then applied to the mixer tube 26 in conjunction with the 15 mc. signal provided by the filter 6. The mixer circuit 26 serves to provide a difference frequency equal to the required ten megacycles.

In order to accomplish generation of desired frequencies in response to setting of the single wheel 55 the following schedule of dial settings against settings of selector switch 22 of the harmonic selector 21 must be observed.

| Dial Setting 55 | Settings of Selector Switch 22, mcs. |
|---|---|
| 00 | 14 |
| 01 | 15 |
| 02 | 16 |
| 03 | 17 |
| 04 | 18 |
| 05 | 19 |
| 06 | 20 |
| 07 | 21 |
| 08 | 22 |
| 09 | 23 |
| 10 | 24 |
| 11 | 10 |
| 12 | 11 |
| 13 | 12 |
| 14 | 13 |
| 15 | 14 |
| 16 | 15 |
| 17 | 16 |
| 18 | 17 |
| 19 | 18 |
| 20 | 19 |
| 21 | 20 |
| 22 | 21 |
| 23 | 22 |
| 24 | 23 |
| 25 | 24 |

It will be noted then, that if the dial wheel 55 be considered to have its initial setting when it reads 11, that the harmonic selector 21 must be established at its initial value of 10 mc., and that successive advances of the dial wheel 55 are accompanied by similar advances of the selector switch 22 of the harmonic selector 21.

In proceeding retrogressively from the wheel setting 11, corresponding with a setting of the harmonic selector switch 22 to select a harmonic 10 mc., the next two steps on the wheel 55 are found to be blank, and the next step thereafter, which reads 10, requires again that the selector arm 22 contact the switch contact corresponding with the frequency 24 mc. It is likewise essential that the tunable filter 24 be retuned to pass a suitable frequency, depending upon the setting of the remaining counter wheels. Transfer of the switch arm 22 from the contact corresponding with 10 mc. to the contact corresponding with 24 mc., in response to a change of three positions of the dial 55, is accomplished by means of the high speed Geneva reduction gear 76, detailed operation of which will be explained hereinafter, and which drives the selector arm of selector switch 22 via the shaft 75, and the speed change gearing 76*a*. Since the differential gearing 85 which drives the tuning condenser 88 of the tunable filter 24 is driven from the shaft 75, the tunable filter condenser 88 likewise always acquires tuning positions corresponding with the settings of the selector arm 22, as will also the tuning condenser 35 of the tunable output filter 33, driven from the shaft 60 by the speed change gearing 89.

The output filter circuit 40, which serves to pass frequencies in the band 4.7 to 11 mc., and the output selector circuit 41, corresponding with the frequency range 2 to 4.7 mc., are tuned via speed change gearings 105 and 106, respectively, actuated by the output of a differential gearing 107, which is in turn driven from the output of the differential gearing 83, which inserts into the differential gearing 107 shaft positions corresponding with frequency variations over the range 1 to 2 mc. The differential gearing 107 is further driven from a Geneva reduction gear 108, which is coupled mechanically with the ten turn dial 65 which serves to establish positions of the counter wheel 55. Accordingly, the differential gear 107 provides output positions on its output shaft corresponding with the numerical position of the counter wheel 55, to which has been added a setting corresponding with the tuning of the tunable output filter 19, the speed changes accomplished by the Geneva reduction gearing 108, and by the speed change gearings 105 and 106 being so arranged that the tuning condensers of the tunable filter circuits 40 and 41 continually tune over their ranges, but so that the filter 40 covers the frequency ranges 4.7 to 11 mc. while the output of the mixer circuit contains corresponding components, and so that the tunable filter circuit 41 covers the range 2 to 4.7 mc. while the output of the mixer circuit 26 covers that range. Correspondence is thus maintained between the tuning of the filters 40 and 41 and the frequencies applied thereto within the ranges stated, but not otherwise. Since the output of the differential gear 107 covers a range of frequencies greater than that covered by either of the filters 40 or 41, the condensers which tune these filters are arranged to have driving shafts which are continually rotatable through 360°, the condensers varying in capacity, however, only sufficiently to provide the desired output frequency ranges.

The filter circuits 37, 38 and 39 are driven from the differential gearing 83, by speed change gearings 110, 111 and 112, respectively. The filter circuit 38 is tuned by means of a variable condenser which serves to vary the frequency of the tunable circuit 38 over the band 1 to 2 megacycles, in response to the gear 111, and is tuned in precise synchronism with the motion of the condenser 20 which tunes the tunable filter 19, so that the tuning of the tunable circuit 38 remains in synchronism with the tuning of the tunable filter 19 at all times.

The tuning condensers of the tuned circuits 37, 39 are driven by the speed change gearings 110 and 112, respectively, in response to the motion of the output shaft of the differential gear 83. The shafts of these condensers are continually variable, over 360° of rotation. The capacity variations introduced by the condensers, however, occur only at certain predetermined positions of the driving shafts of the condensers, these positions being so allocated and maintained that while the mixer circuit 26 provides appropriate frequencies, the tunings of the filters 37, 39 are correspondingly varied by the condensers, and the desired frequencies selected to the exclusion of undesired frequencies.

It will be noted that the shafts which drive the tuning condensers of the variable filter circuits 33, 37, 38, 39, 40 and 41 are continually rotatable with changes of desired frequency, but that these circuits are selectively connected in the plate circuit of the mixer tube 26 by means of selective switches 36, 42, 43, 44, 45 and 46.

*Selection of output circuit of mixer-amplifier 25*

Selection of filter circuits 33 and 37 to 41, inclusive, is accomplished as follows: Three selector switches 120, 121 and 122 are provided, selector switches 121 and 122 each containing twelve contacts arranged about the periphery of a circle. Rotative selector arms 123, 124 accomplish selection in the switches 121 and 122, respectively. The switch 120 includes sixteen switch contacts equally spaced about the circumference of a circle, and a switch arm 125, some of the contacts being blank. The switch arms 123 and 124 are driven in tandem with the arm of selector switch 17 of the harmonic selector 16, there being a one-to-one correspondence between the frequency significance of successive ones of the contacts of the selector switches 17 and 121, some contacts of the latter being, however, blank, and having no frequency significance. The switch arm 125 of the switch 120 is driven in tandem with the arm of selector switch 22 of the harmonic selector 21, and the frequency significance of switch positions of the switch 120 correspond with those of the selector switch 22 making allowance for some blank contacts. Ground potential is transferred, via the contact 126 of the micro-switch 97, when the cam follower 95 is on the dwell 93 of the cam 92, to one terminal of each of the normally de-energized relays 127, 128, 129, 130 and 131, which, when selectively energized close selected ones of the switches 42—46, inclusive. The positive terminal of potential source 102 is connected to the selector arm 125, and the remaining terminal of the relay 130 is connected with each of those contacts of the switch 120 representing the frequencies 18, 19, 20, 21, 22, 23 and 24 mc., inclusive. Accordingly, while the selector arm 125 is in contact with any one of the contacts corresponding to 19 to 24 mc., inclusive, the harmonic selector 21 generates corresponding frequencies, and at the output of the tunable filter 24 may be available any frequency ranging from 20 to 26 megacycles, inclusive. From these frequencies is subtracted the frequency 15 mc. provided by the filter 6, so that the relay 130 will be energized at least while the output of the filter 40 contains a desired frequency component in the range 5 to 11 megacycles. Additionally, while the switch arm 125 is on the 18 mc. contact of the switch 120 a circuit is completed via the lead 132 to the switch arm 124 of the switch 122, and while the latter is in contact with any of the 1.6, 1.7 or 1.8 mc. contacts of the switch 122, a circuit is completed via the lead 142 to the relay 130. Accordingly, the relay 130 is energized additionally for the range of frequencies 4.7 to 5 megacycles.

The relay 131 is required to be energized when the desired frequency falls within the range of frequencies 2 to 4.7 mc. Voltage from the source 102 is conveyed to the relay 131 via the arm 125 while the latter is in contact with either the 16 or the 17 mc. contacts of the switch 120. While the switch arm 125 is in contact with contacts 16 and 17 of the switch 120, the harmonic selector 21 is generating frequencies of 16 and 17 megacycles, to which is added the output of the tunable mixer falling in the frequency range 1 to 2 mc., so that the tunable filter 24 provides a range of frequencies 17 to 19 mc. On subtracting 15 mc. from the range 17 to 19 mc. the remainder is 2 to 4 mc. Accordingly, the switch 120 serves to energize the relay 131 while the mixer circuit 26 provides desired output frequencies in the range 2 to 4 mc. The relay 131 is energized over an additional circuit involving the lead 132, which provides a circuit from those contacts of the switch 122 covering the range of frequencies 0.9 to 1.5 mc., inclusive, the circuit then proceeding via the contact arm 124, the lead 132, the 18 mc. contact of the switch 120, and the contact arm 125, to the positive side of the source of potential 102. Accordingly, while the contact arm 125 of the switch 120 is set to 18 mc., and while the contact arm 124 of the switch 122 sweeps over the range of frequencies .9 to 1.5 mc., the relay 131 is energized. Since the range of positions .9 mc. to 1.5 mc. of the switch 122 correspond with output frequencies from the tunable filter 19 in the range 1.0 to 1.7 mc., and since these frequencies added to the frequency 18 mc. provide a range of frequencies 19 to 19.7 mc., from which must be subtracted the frequency 15 mc. it will be apparent that the relay 131 is energized over the range of frequencies 2 to 4.7 mc., making available a total range for the relay 128 covering the band 2 to 4.7 mc.

Relay 128 is required to be energized when the desired output frequency falls within the range 1–2 mc. This occurs when harmonic selector 21 provides an output frequency of 15 mc. for all positions of switch arms 123 and 124. The range of positions .9 mc. to 1.8 mc. for switches 123 and 124 correspond with output frequencies from tunable filter 19 in the range 1–2 mc. With switch arm 125 on position 15, the output of tunable filter 24 varies from 16 to 17 mc. From this range of frequencies is subtracted the frequency 15 mc., in the mixer 25, leaving the range of frequencies 1–2 mc.

The relay 127 is energized while the switch arm 123 of the switch 121 covers the range of contacts equivalent to frequencies of 1.5 to 1.8 mc., inclusive, and the switch arm 125 of the switch 120 is on position 14 mc. Accordingly, the relay 127 is energized while the harmonic selector 21 generates 14 mc., and while the tunable output filter 19 supplies the mixer 23 with frequencies in the range 1.6 mc. to 2 mc., the tunable filter 24 then supplying frequencies in the range 15.6 to 16 mc., to the mixer 26 and when the frequency 15 mc. supplied by the filter 6 is subtracted provides a range of frequencies .6 to 1.0 mc.

The relay 129 is energized while the switch arm 123 of the switch 121 sweeps over the contacts corresponding with 1.2, 1.3 and 1.4 mc. of the switch 121, and the switch arm 125 of the switch 120 simultaneously is on the 14 mc. contact of the switch 120. Accordingly, the relay 129 is energized while the output of the tunable filter 24 falls within the range of frequencies 15.3 to 15.6 mc., inclusive. When 15 mc. is subtracted from this range of frequencies, there remains the range of frequencies .3 to .6 mc.

*High speed Geneva gearing*

The high speed Geneva gearing system 76, hereinbefore referred to, and which performs the function of translating the positions of the counter wheel 55 into motions of the shaft 75, and consequently of the selector switch 22, in accordance with the schedule of relative positions hereinbefore provided, is illustrated in Figure 2 of the drawings. The shaft 150 is driven from the ten turn dial 65, which rotates the shaft 150 ⅓ turn for each position of the dial 65, and hence for each numeral position added to or subtracted from the counter wheel 55.

Secured to the shaft 150 is a motion transfer gear 151 comprising three equally spaced teeth or pawls 152, which serve to transfer motion of the transfer gear 151 to successive teeth of a gear segment 153 having a total of 15 gear teeth, rotation of one of the transfer teeth or pawls 152 past the gear segment 153 serving to advance the latter by an angle equal to the spread of one gear tooth of the gear segment 153. Assuming a clockwise rotation of shaft 150 the gear segment 153 rotates counter-clockwise, and the first tooth 154 of the gear segment 153 corresponds with the numerical position of counter wheel 55 equal to 11, the last gear tooth 155 corresponding then to numeral position 25 of the counter wheel 55.

Actuating the gear segment 153 in a clockwise direction, i. e. toward the gear tooth 154, a further rotation of transfer gear 151, after the gear tooth 154 has been reached, entrains the gear segment 156, driven by the shaft 150, with the gear segment 157. The gearing ratio between gear segments 156 and 157 is such that upon two thirds of a revolution of the shaft 150 the entire gear segment 157 is passed and upon a succeeding actuation of the shaft 150 through one third of a revolution a transfer tooth 152 again engages and actuates the gear tooth 155 of the gear segment 153.

It will be recalled that between the numerals 11 and 10 on the counter wheel 55 exists two blank spaces, bearing no numerals. Hence in transferring from gear tooth 154 corresponding to numeral 11 of counter 55, to gear tooth 155, corresponding with numeral 10 of counter 55, or vice versa, via gear segment 157, three positions of the counter are traversed, corresponding with one complete revolution of shaft 150. Thereafter, successive partial rotations of shaft 150 result in successive advances of gear segment 153 and hence of shaft 75 driven thereby, from numeral position 10 to numeral position 00.

A series of concave surfaces 158 aligned with the teeth of the gear segment 153, is provided, which mesh with the convex surfaces 159 intermediate the transfer teeth 152, retaining the gear segment immovable except in response to motion of transfer teeth 152. The recesses 160, aligned with the transfer teeth 152, and separating successive convex surfaces 159 enable movement of gear segment 153 in response to actuation by transfer teeth 152, all in conventional manner, per se.

*Operation*

The operation of the present system will now be reviewed, illustrating the manner in which a representative output frequency, arbitrarily taken to equal 10,999.99 kilocycles, is established on the output lead 47, in response to a setting of the counter wheels 55, 54, 53, 52, 51, 50, inclusive, to that same value. Upon establishing the last three dials 52, 51, 50 to read 999, the interpolation oscillator 7 is tuned to provide an output frequency equal to 129.99 kc. This frequency is subtractively combined in the mixer 9 with the 100 kc. signal provided by the crystal oscillator 1, and selected by means of the output filter 10, at the output of which is accordingly established a frequency of 29.99 kc.

The numeral 9 having been established on the dial 53, the harmonic selector 11 is positioned, via the shaft 70, to provide an output frequency of 170 kc. This frequency is added, in the mixer 13, with the output of the filter 10, to provide an input to the tunable output filter 14 equal to 170 and 29.99=199.99. The tunable output filter 14 is tuned by means of the differential gearing 79, to the input of which has been applied the settings of the counter wheels 52, 51, 50 and the setting of the counter wheel 53, via appropriate relative gear reductions, having due regard for the relative decimal values of the frequencies involved, so that the tunable output circuit 14 is tuned to the frequency 199.99, but excludes from its output other frequency components present in the output circuit of the mixer 13.

Frequency 199.99 is now applied to the input of the mixer 18, and the numeral 9 having been established on the counter wheel 54, its position is transferred to the harmonic selector 16, the latter providing at its output a frequency of 1.8 mc. The mixer 18 combines the two frequencies applied thereto to wit, 1.8 mc. and 199.99 kc., providing an output frequency from the mixer equal to 1,999.99 kc.

This output frequency is selectable by the tunable output fillter 1, which is tuned by means of the differential gearing 83 to the required frequency, and which serves to exclude from the output of the tunable mixer 18 undesired frequency components resulting from conversion in the mixer 18.

The frequency 1,999.99 kc. is applied to the input of the further mixer 23, to which is likewise applied a harmonic selected by the harmonic selector 21, in accordance with the numerical setting of the counter wheel 55. The counter wheel 55 is set to the numeral 10, which, in accordance with the schedule hereinbefore provided, may be seen to correspond with the frequency stting 24 mc. of the harmonic selector 21, and accordingly a signal having a frequency of 24 mc. is applied to the input of the mixer 23, for combination therein with the frequency 1,999.99 kc. deriving from the tunable output filter 19. The output of the mixer 23, equal to the sum of the frequencies 1,999.99 kc. and 24,000.00 kc., equals 25,999.99 kc. The latter frequency is applied to the mixer amplifier 25 after being selected by the tunable output filter 24, which has been tuned by the output shaft of the differential gearing 85, the latter adding the two shaft positions corresponding with the frequency components 1,999.99 kc. and 24 mc., the former via suitable reduction gearing in response to the output of the differential gear 83, and the latter deriving from the shaft 75 which positions the selector switch 22 associated with the harmonic selector 21.

In response to setting of the numerals 10 into the dial 55, the relay coil 100 remains de-energized in response to the position assumed by the cam 92 in the circumstances, so that a frequency of 15 mc. is applied to the input grid 27 of the pentode 26 comprised in the mixer amplifier 25 for combination with the frequency 25,999.99 kc. deriving from the tunable output filter 24.

The switch arm 125 of the switch 120 is positioned against the 24 mc. contact of switch 120 in response to positioning of the counter wheel 55 to show the numerals 10, in accordance with the schedule hereinbefore provided. Accordingly, positive potential from the potential source 102 is applied via the switch arm 125 to the lead 142, and thence to one terminal to the relay 127, the other terminal of which is grounded via the now closed switch 126. In response to energization of the relay 127, the switch 42 closes, inserting the tunable output filter 37 in the plate circuit of the pentode 26. The position of the tuning condenser of the output filter 37 is determined by the output shaft of the differential gear 107, the input shafts of which are driven from the counter wheel 55 via appropriate speed reduction gearing and via the output of the differential gear 83 which controls the tuning of the tunable filter 19. The position of the counter wheel 55, however, is applied to the differential gear 107 via a Geneva reduction 108 rather than by the high speed Geneva reduction gear 76, so that the input to the differential gear 107 corresponds with the position corresponding to the numerals 10 of the counter wheel 55 rather than the position 24 as is true of the differential gear 85. The differential gear 83, on the other hand, has been positioned to a frequency representative of 999.99 kc. which, when added to the shaft position corresponding to the frequency 10 mc. enables application from the output shaft of the differential gear 107 of a tuning position corresponding with the frequency 10,999.99 kc. for application to the tuning condenser of the filter 37. The filter 37 being appropriately tuned, the desired frequency 10,999.99 kc. appears on the plate 29 of the pentode 26 and is applied via the output lead 47.

The manner in which any other desired frequency in the band .3 mc. to 26 mc. may be derived in accordance with the present invention and with the embodiment herein described, is quite analogous to that explained above in connection with a specific frequency 10,999.99 kc.

While I have disclosed one specific embodiment of the invention, it will be clear that variations of the general arrangement, and of details thereof, may be resorted to without departing from the true spirit and scope of the invention.

I claim as my invention:

1. In combination in a source of signals tunable over a predetermined range, means for generating a first plurality of harmonics having a predetermined frequency separation $f$ and extending over a first predetermined range of frequencies, means for generating a further plurality of harmonics having a predetermined frequency separation $$\frac{f}{10}$$

and extending over a further predetermined range of frequencies, first means for selecting one of said first plurality of harmonics, second means for selecting one of said further plurality of harmonics, means for combining said selected one of said first plurality of harmonics with said selected one of said further plurality of harmonics to provide a predetermined conversion product, said means for combining comprising a mixer circuit, and means for tuning the output of said mixer circuit to the frequency of said predetermined conversion product in response solely to operation of said first and second means for selecting.

2. In a frequency producing system for generating a desired frequency within a given frequency range, a plurality of primary frequency sources arranged in groups, each of said groups comprising a number of primary frequency sources having frequencies in accordance with an arithmetical series, the frequency ranges covered by each of said groups being related in successive powers of 10, means for selecting from each of said groups a single frequency, means for additively combining said frequencies from a pair of said groups, said last named frequencies being related in successive powers of 10, said means for combining comprising a mixer circuit, means for tuning the output of said mixer circuit to the sum frequency of said last named frequencies, said means for tuning comprising a tuner and differential gearing having a pair of input shafts and an output shaft, means for establishing an angular position for one of said input shafts in accordance with the value of the higher one of said last named frequencies, means for establishing an angular position for the other of said input shafts in accordance with the value of the lower one of said last named frequencies divided by 10, said output shaft actuating said tuner.

3. In a system for generating any desired frequency within a given frequency range, a master oscillator for producing a fixed frequency, a plurality of harmonic and sub-harmonic generators responsive to said master oscillator, and an interpolation oscillator, each of said generators producing groups of primary frequencies each arranged in accordance with an arithmetical series, the frequency ranges covered by each of said groups falling within frequency ranges related in successive powers of 10, means for selecting from each group a single frequency, means for adding the difference of the frequencies of said interpolation and said master oscillators with said single frequency selected from said group of lowermost frequency to form a first resultant sum frequency containing the lowermost digits contained in the desired frequency, means for combining said first resultant sum with said single frequency selected from said groups of frequencies next higher than said lowermost frequency to form a second resultant sum frequency containing said lowermost digits plus one additional digit of said desired frequency, means for combining said second resultant sum frequency with a frequency selected from said group of frequencies next higher than said last mentioned group of frequencies to form a third resultant sum frequency containing said lowermost digits plus two additional digits of said desired frequency.

4. A system for producing a high frequency wave of an accurately predeterminable frequency, comprising, a single signal source of constant frequency, means for deriving from said source a plurality of groups of waves, the waves within each group being decimally related to the frequency of said single source, each group containing frequencies arranged in an arithmetic series containing at least 9 elements, and the frequency ranges covered by successive groups differing by powers of 10, an interpolation oscillator, a plurality of indicator wheels each having at least the numerals from 0 to 9 inclusive appropriately arranged thereon, and each corresponding with a digit of said high frequency wave, means for establishing a decimal number comprising one numeral on each of said wheels and representing the frequency of said high frequency wave, means responsive to the numerical settings of said wheels comprising means for selecting one frequency from one of said groups and a frequency of said interpolation oscillator, means for combining the last mentioned frequency with said one frequency from one of said groups to form a combination frequency containing a predetermined number of lower order numerals partially identifying said frequency of said high frequency wave, means for successively generating further combinatory frequencies by combining successively formed combinatory frequencies with selected frequencies from said groups taken in succession to form combinatory frequencies containing successively additional digits of the decimal number corresponding with the frequency of said high frequency wave.

5. In combination, means for producing a first plurality of frequencies having values forming a first arithmetic series, means for producing a second plurality of frequencies having values forming a second arithmetic series, the numerical difference between components of said second arithmetic series being greater by a factor of 10 than the numerical difference between components of said first arithmetic series, said first arithmetic series constituted by ten numerals, said second arithmetic series constituted of more than ten numerals, means for selecting one of said first and one of said second plurality of frequencies, means for mixing said selected frequencies to derive a resultant frequency equal to the sum of said selected frequencies, an output circuit, means responsive to selection of predetermined ones of said second plurality of frequencies for transferring said resultant frequency to said output circuit, a further mixer, means responsive to selection of other than said predetermined ones of said second plurality of frequencies for applying signals deriving from said source of signals and said resultant frequency to said further mixer, means for selecting a conversion product from said further mixer, and means for transferring said conversion product to said output circuit.

6. In combination, means for producing a first plurality of frequencies in accordance with a first arithmetic series, means for producing a second plurality of frequencies having values forming a second arithmetic series, the numerical difference between component frequencies of said second arithmetic series being greater by a factor of ten than the numerical difference between components of said first arithmetic series, a first settable indicator having a numerically calibrated surface, a second settable indicator having a numerically calibrated surface, means responsive to the settings of said first and second indicators for providing a selected frequency component from each of said first and second plurality of frequencies, means responsive to a predetermined range of settings of said second settable indicator for converting said selected frequency components to a frequency equal to the sum of the values of said selected frequency components, means responsive to a further predetermined range of settings of said second settable indicator for converting said selected frequency components to a frequency equal to the sum of the values of said selected frequency components less a constant value.

7. In a system for generating any desired frequency with a given frequency range, a master oscillator for producing a fixed frequency, a plurality of harmonic and sub-harmonic frequency generators responsive to said master oscillator, and an interpolation oscillator, each of said generators producing groups of oscillations at frequencies arranged in accordance with a different arithmetic series, and the frequencies included in the separate groups falling within frequency ranges differing respectively in successive powers of ten, means for selecting from each of said groups a single selected frequency, means for combining said selected frequencies so that the numerical value of the sum of said frequencies added to the frequency difference between said interpolation oscillator and said master oscillator is equal to said desired frequency when said desired frequency falls within a predetermined sub-range of said given frequency range, and so that the numerical value of the sum of said frequencies added to the frequency difference between said interpolation oscillator and said master oscillator is equal to a constant frequency plus said desired frequency for desired frequencies within a frequency range falling without said predetermined sub-range.

8. In a system for generating any desired frequency within a given frequency range, a master oscillator for producing a fixed frequency, a plurality of harmonic and sub-harmonic frequency generators responsive to said master oscillator, and an interpolation oscillator, each of said generators producing groups of oscillations at frequencies arranged in accordance with different arithmetic series and the frequencies included in the separate groups falling within frequency ranges differing respectively in successive powers of ten, means for selecting from each of said groups a single selected frequency, the numerical value of the sum of said selected frequencies added to the frequency difference between said interpolation and master oscillators being equal to said desired frequency when said desired frequency falls within a predetermined sub-range of said given frequency range, and the numerical value of the sum of said frequencies added to the frequency difference between said interpolation and master oscillators being equal to a constant frequency plus said desired frequency for desired frequencies within said given frequency range falling without said predetermined sub-range, an amplifier-mixer, a source of oscillations at said constant frequency, means responsive to selection of a frequency within said sub-range for connecting said amplifier-mixer as an amplifier to amplify said selected frequency, and means responsive only to selection of a frequency falling without said predetermined sub-range for subtractively combining oscillations from said source of oscillations at said constant frequency with said sum of said frequencies added to the frequency difference between said interpolation and master oscillators to generate said desired frequency.

9. In a system for generating any desired frequency within a given frequency range, a master oscillator for producing a fixed frequency, a plurality of harmonic and sub-harmonic frequency generators responsive to said master oscillator, and an interpolation oscillator, each of said generators producing a group of oscillations at frequencies arranged in accordance with a different arithmetic series, and the frequencies included in the separate groups falling within frequency ranges differing respectively in successive powers of ten, means for selecting from each of said groups a single selected frequency, the numerical value of the sum of said selected frequencies added to the frequency difference between said interpolation and master oscillators being equal to said desired frequency when said desired frequency falls within a predetermined sub-range of said given frequency range, and the numerical value of the sum of said frequencies being equal to a constant frequency plus said desired frequency for frequencies within said given frequency range falling without said predetermined sub-range, an amplifier-mixer, a source of oscillations at said constant frequency, means responsive to selection of a sum of said selected frequencies added to the frequency difference between said interpolation and master oscillators falling within said sub-range for connecting said amplifier-mixer as an amplifier to amplify said desired frequency, and means responsive only to selection of a desired frequency falling without said predetermined sub-range for subtractively combining oscillations from said source of oscillations at said constant frequency with said sum of said frequencies added to the frequency difference between said interpolation and master oscillators to generate said desired frequency, a plurality of continuously tunable output circuits for said amplifier-mixer, means for selectively connecting said continuously tunable output circuits to said amplifier-mixer in accordance with the value of said desired frequency, and means for tuning each of said tunable output circuits for said amplifier-mixer in response to said means for selecting from each of said groups a single frequency.

10. In a system for generating any desired frequency within a given frequency range, a master oscillator for producing a fixed frequency, a plurality of harmonic generators responsive to said master oscillator to generate each a group of frequencies arranged in an arithmetic series, the frequencies of the separate groups falling within frequency ranges differing respectively in successive powers of ten, a plurality of members positionable to establish a multi-digit number equal to said desired frequency, means responsive to the positions of said positionable members for selecting a single frequency from each of said groups, means comprising a plurality of frequency converters each comprising a tunable output circuit, means for applying to each of said frequency converters a pair of frequencies, one of said pair of frequencies deriving from one of said means for selecting and another of said pair of frequencies deriving from another of said frequency converters, means for tuning each of said tunable output circuits to a frequency equal to the sum of frequencies applied to the mixer associated therewith in response to positioning of said positionable members, the numerical value of the output frequency of highest digital order being equal to said desired frequency when said desired frequency falls within a predetermined sub-range of said given frequency range, means responsive to positioning of said members to establish a further multi-digit number falling without said predetermined sub-range for selecting said frequencies and for tuning said output circuits to provide oscillations at frequencies such that the numerical value of said output frequency of highest digital order equals said desired frequency plus a predetermined frequency, an amplifier-mixer, means responsive to positioning of said positionable members to establish a multi-digit number equal to any value within said predetermined sub-range for applying only said output frequency of highest digital value for amplification by said amplifier-mixer, and means responsive to positioning of said positionable numbers to establish a multi-digit number equal to a value without said predetermined sub-range for applying said output frequency of highest digital value and an oscillation of said predetermined frequency for subtractive conversion in said amplifier-mixer.

11. In a system for generating a desired frequency within a predetermined frequency range, a first counter wheel containing ten digital positions, from 0 to 9, inclusive, a second counter wheel containing more than ten digital positions, means responsive to motion of said first counter wheel from the 9 position to the 0 position, or vice versa, for transferring an increment of motion to said second counter wheel equal to one digital position thereof, a first harmonic generator, a second harmonic generator, a first harmonic selector for selecting harmonics generated by said first harmonic generator in response to the digital position of said first counter wheel, a second harmonic selector for selecting harmonics generated by said second harmonic selector in response to the digital position of said second counter wheel, said second harmonic selector comprising means for selecting fewer harmonics than the number of digital positions of said second counter wheel, means responsive to a predetermined plurality of digital positions of said second counter wheel for controlling said second harmonic selector for selecting a single frequency only, and means for converting the frequencies selected by said harmonic selectors to a frequency numerically equal to the combined digital settings of said counter wheel for all digital settings thereof.

12. In a system for generating a desired frequency within a predetermined range of frequencies, a harmonic generator for generating a first predetermined plurality of harmonically related oscillations having frequency arranged in an arithmetic series, a positionable member having a further predetermined plurality of discrete positions, means responsive to positioning of said positionable member to successive ones of a first group of said further predetermined plurality of discrete positions for selecting in succession said plurality of harmonically related oscillations, means responsive to positioning of said positionable member to successive ones of a further group of discrete positions for again selecting in succession predetermined ones of said plurality of harmonically related oscillations, a frequency converter, means responsive to positioning of said positionable member to successive ones of said first group of said further predetermined plurality of discrete positions for applying a selected one of said plurality of harmonically related oscillations only to said frequency converter for transmission thereby, means for generating a further oscillation of fixed frequency coinciding with one of said frequencies of said harmonically related oscillations, and means responsive to positioning of said positionable member to successive ones of said further group of discrete positions for applying said further oscillation and a selected one of said harmonically related oscillations to said frequency converter for subtractive conversion therein.

FORREST S. MABRY.

References Cited in the file of this patent

UNITED STATES PATENTS

| Number | Name | Date |
|---|---|---|
| 1,919,803 | Roetkin | July 25, 1933 |
| 2,131,558 | Granger | Sept. 27, 1938 |
| 2,354,800 | Deal | Aug. 1, 1944 |
| 2,501,154 | Berman | Mar. 21, 1950 |

OTHER REFERENCES

Institution of Electrical Engineers Journal (British), vol. 90, Part III, pages 165–180, (1943).